United States Patent
Lee

(10) Patent No.: US 9,236,426 B2
(45) Date of Patent: Jan. 12, 2016

(54) SEMICONDUCTOR DEVICE AND METHOD OF MANUFACTURING THE SAME

(71) Applicant: SK hynix Inc., Gyeonggi-do (KR)

(72) Inventor: Dong Kee Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/693,586

(22) Filed: Apr. 22, 2015

(65) Prior Publication Data

US 2015/0228709 A1    Aug. 13, 2015

Related U.S. Application Data

(62) Division of application No. 13/830,727, filed on Mar. 14, 2013, now Pat. No. 9,040,374.

(30) Foreign Application Priority Data

Dec. 13, 2012 (KR) .................. 10-2012-0145241

(51) Int. Cl.
| | |
|---|---|
| *H01L 21/8234* | (2006.01) |
| *H01L 21/8244* | (2006.01) |
| *H01L 49/02* | (2006.01) |
| *H01L 27/06* | (2006.01) |
| *H01L 45/00* | (2006.01) |
| *H01L 27/24* | (2006.01) |
| *H01L 21/02* | (2006.01) |
| *H01L 21/311* | (2006.01) |
| *H01L 21/3213* | (2006.01) |
| *H01L 21/768* | (2006.01) |
| *H01L 27/115* | (2006.01) |

(52) U.S. Cl.
CPC .......... *H01L 28/20* (2013.01); *H01L 21/02532* (2013.01); *H01L 21/02595* (2013.01); *H01L 21/31111* (2013.01); *H01L 21/32133* (2013.01); *H01L 21/76897* (2013.01); *H01L 27/0629* (2013.01); *H01L 27/11531* (2013.01); *H01L 27/11556* (2013.01); *H01L 27/11573* (2013.01); *H01L 27/11582* (2013.01); *H01L 27/2436* (2013.01); *H01L 45/10* (2013.01); *H01L 45/122* (2013.01); *H01L 45/145* (2013.01)

(58) Field of Classification Search
CPC .. H01L 27/0629; H01L 27/0802; H01L 28/20
USPC ........................................................ 438/238
See application file for complete search history.

(56) References Cited

U.S. PATENT DOCUMENTS

| | | | | |
|---|---|---|---|---|
| 2009/0023263 | A1* | 1/2009 | Phan et al. | 438/384 |
| 2013/0064001 | A1* | 3/2013 | Terai | 365/148 |
| 2013/0200447 | A1* | 8/2013 | Yen et al. | 257/296 |
| 2014/0054708 | A1* | 2/2014 | Cheng et al. | 257/363 |
| 2014/0151627 | A1* | 6/2014 | Hong et al. | 257/4 |
| 2014/0167182 | A1* | 6/2014 | Nandakumar et al. | 257/380 |

* cited by examiner

*Primary Examiner* — Zandra Smith
*Assistant Examiner* — John M Parker
(74) *Attorney, Agent, or Firm* — IP & T Group LLP

(57) ABSTRACT

Disclosed is a semiconductor device having a substrate including first and second regions. First interlayer insulation layers and conductive patterns alternately are stacked on a first region of the substrate. A second interlayer insulation layer covers the first interlayer insulation layers and the conductive patterns. A resistor is formed in the second interlayer insulation layer in the second region of the substrate.

17 Claims, 7 Drawing Sheets

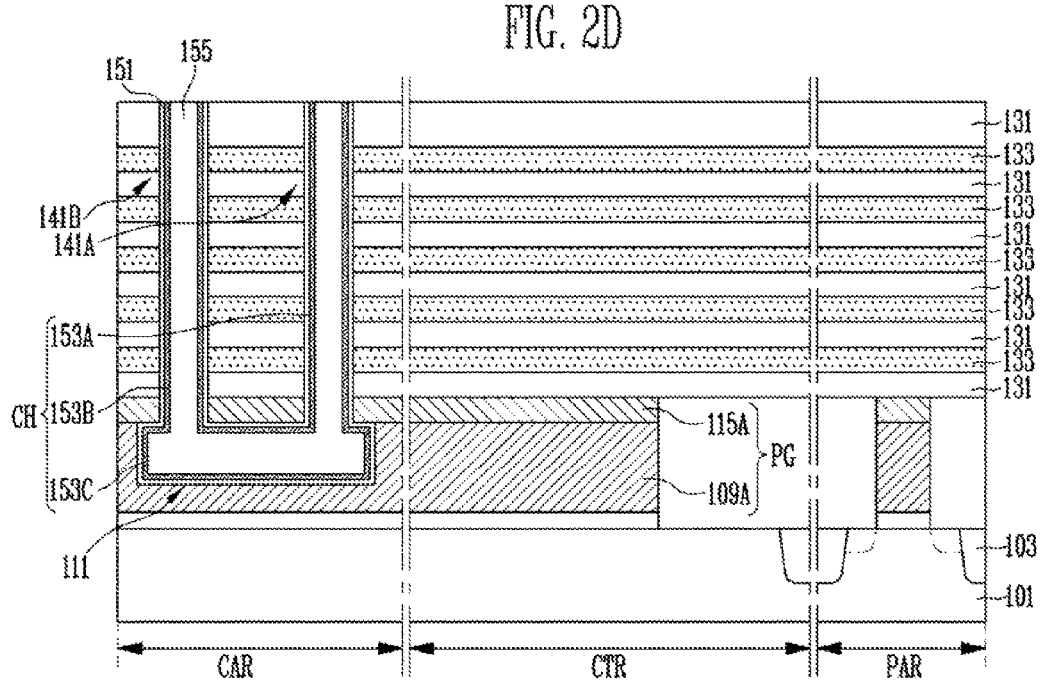
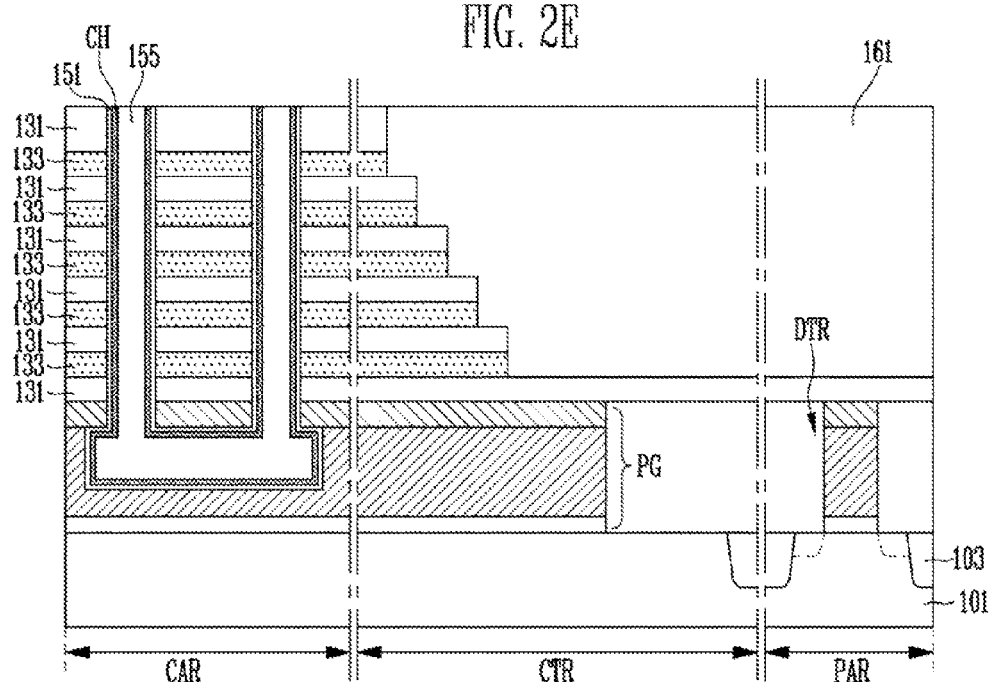

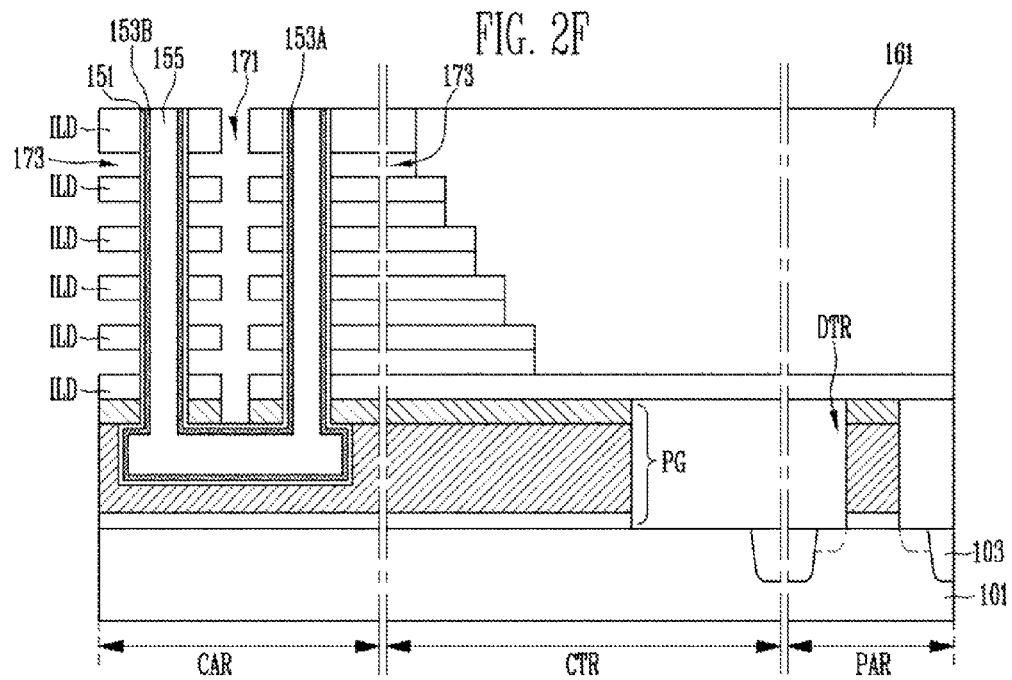
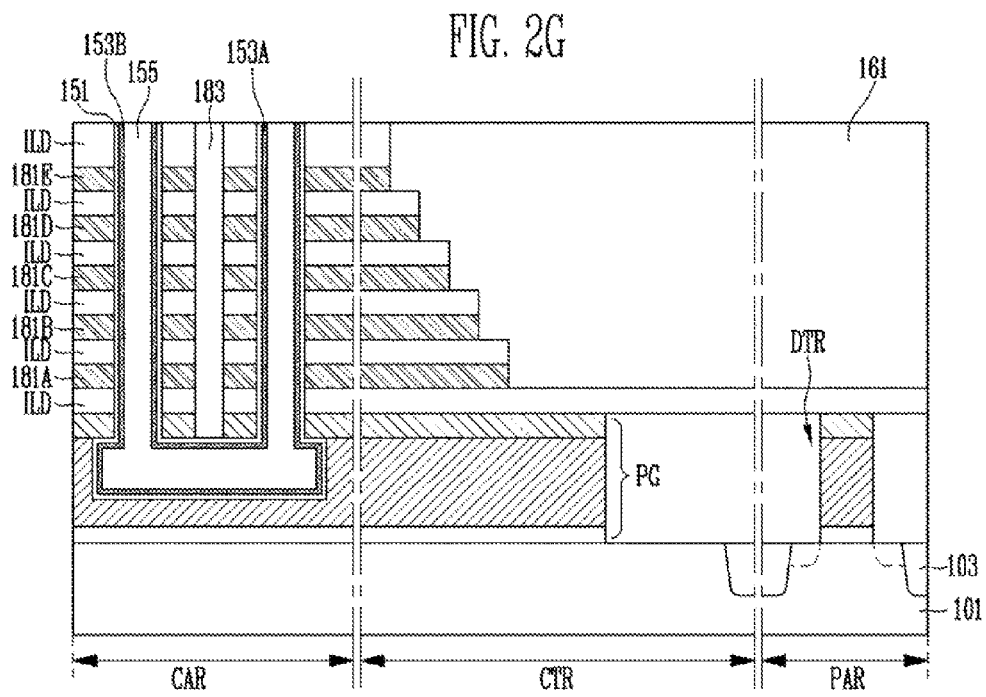

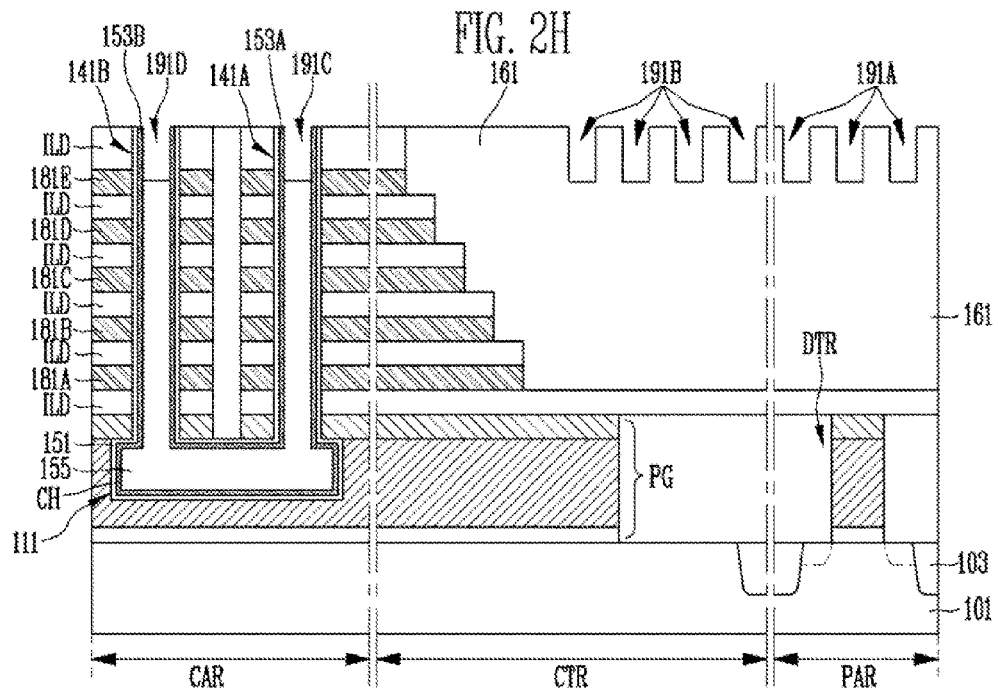
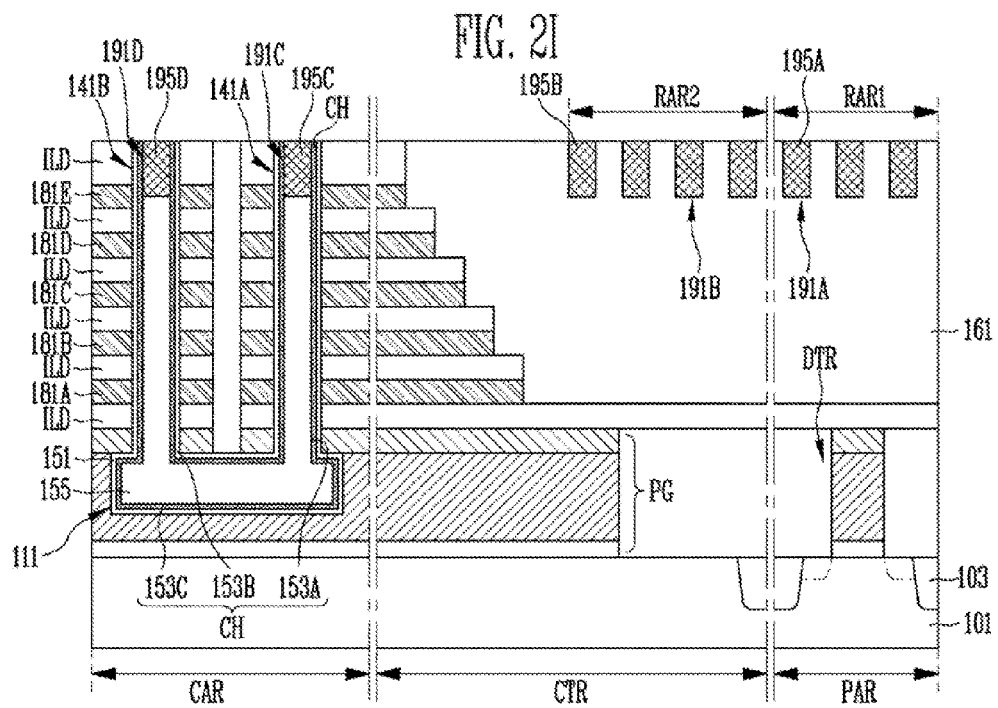

SEMICONDUCTOR DEVICE AND METHOD OF MANUFACTURING THE SAME

CROSS-REFERENCE TO RELATED APPLICATION

This application is a division of U.S. patent application Ser. No. 13/830,727 filed on Mar. 14, 2013, which is based on and claims priority from Korean Patent Application No. 10-2012-0145241, filed on Dec. 13, 2012, with the Korean Intellectual Property Office. The disclosure of each of the foregoing application is incorporated herein in its entirety by reference.

BACKGROUND

1. Field

The present invention relates to a semiconductor device and a method of manufacturing the same, and more particularly, to a semiconductor device including resistors and a method of manufacturing the same.

2. Discussion of Related Art

A semiconductor device uses a resistor in a circuit for applying or controlling an operation voltage of the semiconductor device in order to generate a desired level of bias. The resistor is representatively used in a pump regulator circuit for distributing a voltage. Since the resistor is formed in a single layer having a specific size, several resistors needs to be coupled by using contact plugs and metal wirings in order to implement a necessary resistance value.

In the meantime, in order to improve integration of the semiconductor device, a 3D semiconductor device in which memory cells are three-dimensionally arranged has been suggested. The 3D semiconductor device includes a cell array region, a contact region, a peripheral region, and a resistance element region. The cell array region is a region in which memory cells for storing data, and word lines and bit lines coupled to the memory cells are formed. The contact region is a region in which the word lines extended from the cell array region are arranged. The peripheral circuit region is a region in which driving transistors configuring a circuit for driving the memory cells are arranged. The resistance element region is a region in which the resistors are formed.

The word lines arranged in the contact region and the driving transistors of the peripheral circuit region may be electrically coupled through contact plugs and metal wirings. The resistors in the resistance element region and the driving transistors in the peripheral circuit region are simultaneously formed, so that the driving transistors and the resistors need to be arranged in different regions of a substrate. Further, since a plurality of resistors is formed in the resistance element region, an area of the resistance element region occupied in an entire area of the semiconductor device is large. Accordingly, there is a limit to improve integration of the semiconductor device due to the resistance element region.

SUMMARY

The present invention has been made in an effort to provide a semiconductor device capable of improving integration and a method of manufacturing the same.

An exemplary semiconductor device includes a substrate including first and second regions; first interlayer insulation layers and conductive patterns alternately stacked on a first region of the substrate; a second interlayer insulation layer covering the first interlayer insulation layers and the conductive patterns; and a resistor formed in the second interlayer insulation layer in the second region of the substrate.

An exemplary method of manufacturing a semiconductor device includes alternately stacking first material layers and second material layers on a substrate including a first region and a second region; etching the first material layers and the second material layers formed on the second region; forming an interlayer insulation layer in the second region in which the first material layers and the second material layers are etched; forming a first recess region by etching the interlayer insulation layer on the second region of the substrate; and forming a resistor inside the first recess region.

BRIEF DESCRIPTION OF THE DRAWINGS

The above and other features and advantages of the present invention will become more apparent to those of ordinary skill in the art by describing in detail embodiments thereof with reference to the attached drawings in which:

FIGS. 2A to 2I are views for describing a semiconductor device according to an exemplary embodiment of the present invention, and a method of manufacturing the same.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Figure 1:
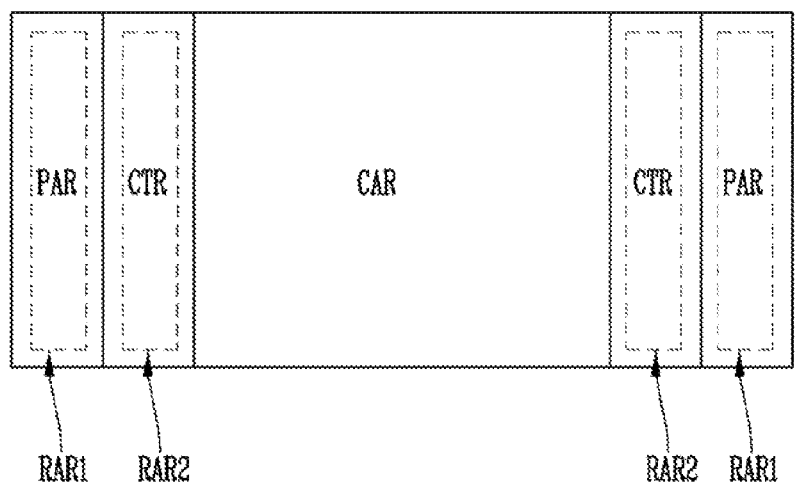
FIG. 1 is a view for describing a semiconductor device according to an exemplary embodiment of the present invention.

FIG. 1 is a view for describing a semiconductor device according to an exemplary embodiment of the present invention.

Referring to FIG. 1, the semiconductor device according to an exemplary embodiment of the present invention includes a cell array region CAR, one or more contact regions CTR, one or more peripheral circuit regions PAR, and one or more resistance element regions RAR1 and RAR2. The cell array region CAR is a region in which cell strings, word lines, first and second select lines, and bit lines are formed. Each of the cell strings includes first and second select transistors, and the memory cells coupled between the first and second select transistors. The bit lines are conductive patterns coupled to the cell strings. The word lines are conductive patterns coupled to gates of the memory cells. The first and second select lines are conductive patterns coupled to gates of the first and second select transistors, respectively.

The contact regions CTR are regions in which edges of the word lines, extended from the cell array region CAR, and edges of the first and second select lines, extended from the cell array region CAR, are arranged. The contact regions CTR may be disposed at both sides of the cell array region CAR.

The peripheral circuit regions PAR are regions in which driving transistors configuring a circuit for driving the memory cells are arranged. The peripheral circuit regions PAR may be adjacently disposed to the contact regions CTR. Although it is not illustrated in the drawing, the peripheral circuit regions PAR may be adjacently disposed to the cell array region CAR. The driving transistors may be coupled to the word lines, the first select line, or the second select line of the contact region CTR through contact plugs and metal wirings.

The resistance element regions RAR1 and RAR2 are regions in which resistors that distribute a voltage are arranged. The resistance element regions RAR1 and RAR2 may overlap at least one of the peripheral circuit regions PAR and the contact regions CTR. For example, the resistance element regions RAR1 and RAR2 may include first resistance element regions RAR1 that overlap the peripheral circuit regions PAR, and second resistance element regions RAR2 that overlap the contact regions CTR.

As described above, the exemplary semiconductor device includes the resistance element regions RAR1 and RAR2 that overlap at least one of the peripheral circuit regions PAR and the contact regions CTR. Accordingly, it is not necessary to prepare a separate space in a substrate for disposing the resistance element regions RAR1 and RAR2, thereby achieving high integration of the semiconductor device.

An exemplary resistor will be described in more detail with reference to the drawings below. For the convenience of description, the cell array region and the peripheral circuit region are illustrated based on one cell string and one driving transistor below, but a plurality of cell strings may be formed in the cell array region and a plurality of driving transistors may be formed in the peripheral circuit region.

FIGS. 2A to 2I are views for describing an exemplary semiconductor device and a method of manufacturing the same.

Figure 2A:
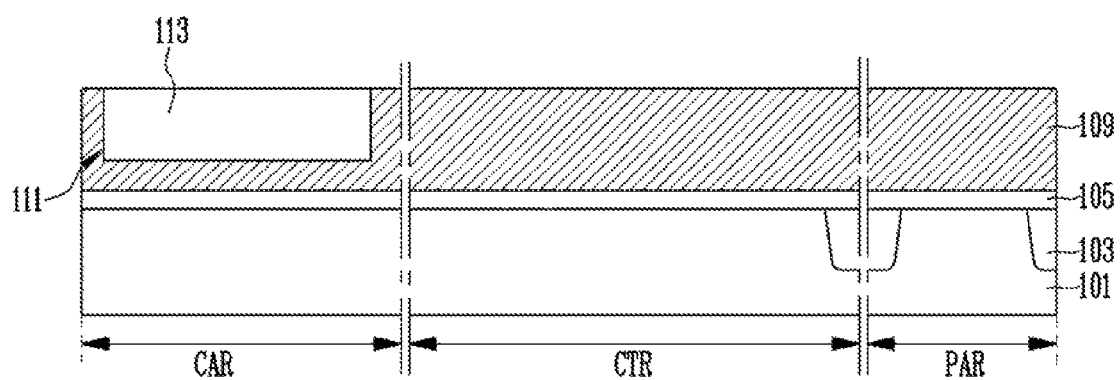

Referring to FIG. 2A, an isolating layer 103 is formed in a substrate 101 including a cell array region CAR, a contact region CTR, and a peripheral circuit region PAR. An impurity for forming a well structure and an impurity for adjusting a threshold voltage may be injected into the substrate 101.

Next, a gate insulation layer 105 and a first conductive layer 109 are sequentially formed on the substrate 101. The gate insulation layer 105 may have the same thickness in the cell array region CAR and the peripheral circuit region PAR. The gate insulation layer 105 may be thicker in the peripheral circuit region PAR, as compared to the cell array region CAR. The gate insulation layer 105 may have may be thinner in the peripheral circuit region PAR, as compared to the cell array region CAR. The first conductive layer 109 may be used as a pipe gate of a pipe transistor and a driving gate of a driving transistor.

Then, a trench 111 is formed by etching the first conductive layer 109 of the cell array region CAR. Next, the trench 111 is filled with a sacrificial layer 113.

Figure 2B:
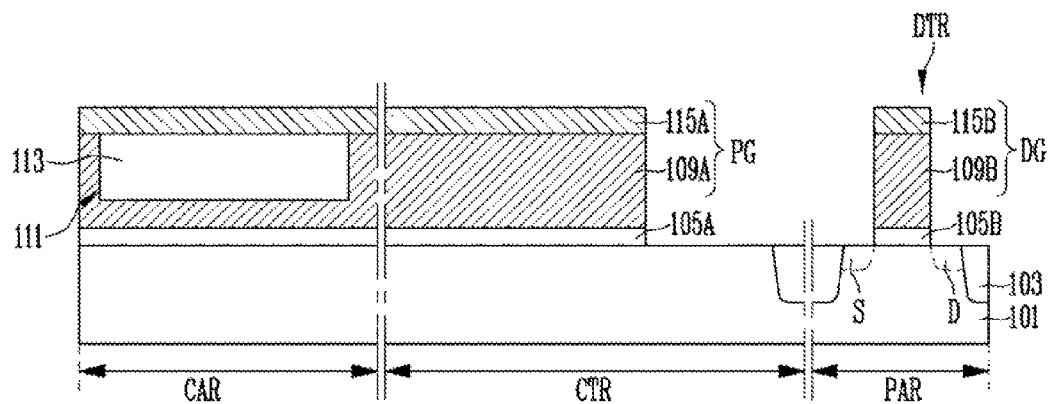

Referring to FIG. 2B, a second conductive layer 115 may be further formed on the first conductive layer 109, including the trench 111 filled with the sacrificial layer 113. Next, a pipe gate PG and a driving gate DG are formed by etching the first conductive layer 109 and the second conductive layer 115. In this case, the gate insulation layer 105 may be further etched so that a first gate insulation pattern 105A may be formed under the pipe gate PG, and a second gate insulation pattern 105B may be formed under the driving gate DG.

The pipe gate PG may be formed of a structure in which a first conductive pattern 109A and a second conductive pattern 115A are stacked. The pipe gate PG is extended toward the contact region CTR from the cell array region CAR.

The driving gate DG may be formed simultaneously with the pipe gate PG, and may be formed in the structure in which a first conductive pattern 109B and a second conductive pattern 115B are stacked.

Subsequently, an impurity for forming a source region S and a drain region D may be injected into the substrate 101 at both sides of the driving gate DG by using a mask (not shown) as an impurity injection barrier. Then, the mask used as the impurity injection barrier may be removed. Accordingly, the driving transistor DTR is formed in the peripheral circuit region PAR.

Figure 2C:
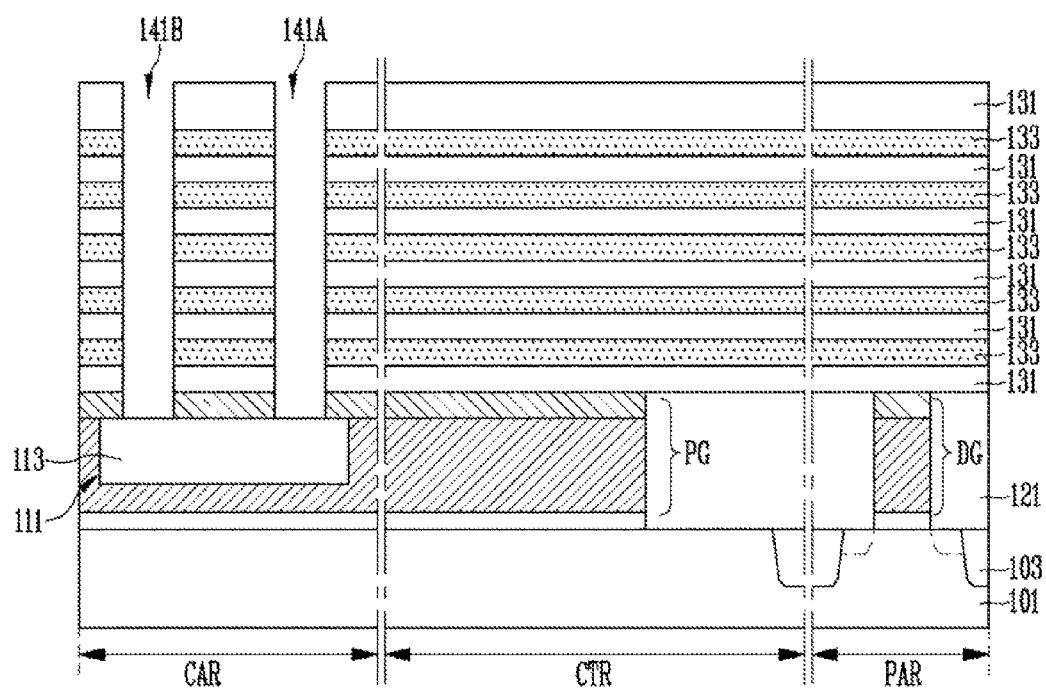

Referring to FIG. 2C, a first interlayer insulation layer 121, filling a space between the pipe gate PG and the driving gate DG, is formed. Next, first material layers 131 and second material layers 133 are alternately stacked on an entire structure, including the first interlayer insulation layer 121, the first conductive pattern 109B, and the second conductive pattern 115B.

The first material layers 131 may be formed where second interlayer insulation layers are formed. The second material layers 133 may be formed where word lines or select lines are formed. The select line may be formed on one or more layers. A layer where a select line is formed and a layer where a word line is formed may have the same or different thicknesses.

The first material layers 131 and the second material layers 133 may be formed with material layers having a large difference etching selectivities. For example, the first material layers 131 may be oxide layers that may serve as second interlayer insulation layers, and the second material layers 133 may be conductive layers, such as polysilicon layers, metal layers, or metal silicide layers. Alternatively, the first material layers 131 may be oxide layers that may serve as the second interlayer insulation layers, and the second material layers 133 may be nitride layers that may serve as the sacrificial layers. Alternatively, the first material layers 131 may be undoped polysilicon layers that may serve as sacrificial layers, and the second material layers 133 may be doped polysilicon layers that may serve as the word lines or the select lines.

Next, first and second through holes 141A and 141B are formed by etching the first material layers 131 and the second material layers 133 of the cell array region CAR. The first and second through holes 141A and 141B are connected to the trench 111. IF the second conductive layer is formed, the first and second through holes 141A and 141B may be formed by further etching the second conductive pattern 115A of the pipe gate PG. Accordingly, the sacrificial layer 113 inside the trench 111 is exposed.

Referring to FIG. 2D, the trench 111 is opened by removing the sacrificial layer 113. As a result, a U-shaped channel hole including the first through hole 141A, the trench 111 connected to the first through hole 141A, and the second through hole 141B connected to the trench 111 is formed.

Next, at least one layer of a third material layer 151 is formed along surfaces defining the first and second through holes 141A and 141B and the trench 111. The third material layer 151 may include at least one of a charge blocking layer, a memory layer, and a tunnel insulation layer. The charge blocking layer may prevent the charges from moving toward the word lines of the memory cell, and may be an oxide layer or a high dielectric layer having a dielectric constant larger than that of the silicon oxide layer. The memory layer serves as a data storing layer of the memory cell, and may be a nitride layer in which a charge may be trapped. The tunnel insulation layer may be formed of an oxide.

Next, a channel structure CH is formed along surfaces defining the first and second through holes 141A and 141B and the trench 111 in which the third material layer 151 is formed. The channel structure CH may be formed in a tubular shape having an open central portion. The channel structure CH includes a first channel layer 153A formed inside the first through hole 141A, a second channel layer 153B formed inside the second through hole 141B, and a pipe channel layer 153C formed inside the trench 111 to couple the first and second channel layers 153A and 153B. The channel structure CH may be formed of a semiconductor material, such as a polysilicon layer.

Next, the central portion of the channel structure CH is filled with a first insulation layer 155.

Sidewalls and a bottom surface of the pipe channel layer 153C are surrounded by the first conductive pattern 109A of the pipe gate PG. Further, a top surface of the pipe channel layer 153C may be covered by the second conductive pattern 115A of the pipe gate PG. The second conductive pattern 115A may serve to increase an electric field applied to the pipe channel layer 153C.

Referring to FIG. 2E, the first material layers 131 and the second material layers 133 are etched, so that edges of the first material layers 131 and edges of the second material layers 133 have a stepwise structure in the contact region CTR. In this case, the first material layers 131 and the second material layers 133 may be removed in the peripheral circuit region PAR. In order to pattern the first material layers 131 and the second material layers 133 in the stepwise structure, a photoresist pattern (not shown) is formed on the first material layers 131 and the second material layers 133, and then the first material layers 131 and the second material layers 133 are repeatedly etched using the photoresist pattern as an etching barrier. A size of the photoresist pattern is reduced whenever the etching process of the first material layers 131 and the second material layers 133. After the stepwise structure is formed, the residual photoresist pattern is removed.

Then, a third interlayer insulation layer 161 is formed on an entire structure in which the stepwise structure is formed. The third interlayer insulation layer 161 fills a region in which the first material layers 131 and the second material layers 133 are etched. The third interlayer insulation layer 161 covers the stepwise structure of the contact region CTR and the driving transistor DTR of the peripheral circuit region PAR. A surface of the third interlayer insulation layer may be flat. In order to planarize the surface of the third interlayer insulation layer 161, a chemical mechanical polishing (CMP) process may be performed.

Referring to FIG. 2F, a slit 171 is formed by etching the first material layers 131 and the second material layers 133 of the cell array region CAR. The first material layers 131 and the second material layers 133 may be isolated for each memory block or be isolated for each line through the slit 171. Further, the side surfaces of the first material layers 131 and the second material layers 133 are exposed through the slit 171. The slit 171 may be formed between the first and second channel layers 153A and 153B, in order to divide the first material layers 131 and the second material layers 133 into a part surrounding the first channel layer 153A and a part surrounding the second channel layer 153B.

A subsequent process may be varied according to a composition of the first material layers 131 and the second material layers 133.

For example, if the first material layers 131 are formed of oxide layers that may serve as second interlayer insulation layers, and the second material layers 133 are nitride layers that may serve as the sacrificial layers, then the second material layers 133 exposed through the slit 171 may be removed by a selective etching process. Accordingly, a first recess region 173 is formed in a region in which the second material layers 133 are removed. Further, second interlayer insulation patterns ILD are formed from the first material layers 131.

Referring to FIG. 2G, conductive patterns 181A to 181E, which serve as the word lines and the select lines, are formed by filling the first recess region 173 with a conductive material. At least one layer of uppermost conductive patterns, among the conductive patterns 181A to 181E, may be used as select lines. Lower conductive patterns may be used as the word lines. The select line that surrounds the first channel layer 153A may be a first select line, and a select line surrounding the second channel layer 153B may be a second select line. One of the first select line or the second select lines is a source select line, and the remaining one of the first select line or the second select lines is a drain select line. Before the first recess region 173 is filled with the conductive material, at least one of the charge blocking layer, the memory layer, or the tunnel insulation layer may be formed in an inner surface of the first recess region 173. For example, a layer, among the charge blocking layer, the memory layer, and the tunnel insulation layer, which is not formed along the inner surface defining the first and second through holes 141A and 141B, may be formed along an inner surface defining the first recess region 173.

Although it is not illustrated in the drawing, if the first material layers 131 are oxide layers that may serve as the second interlayer insulation layers, and the second material layers 133 are conductive layers, then the conductive patterns 181A to 181E and the second interlayer insulation patterns ILD may be defined by the slit 171.

Alternatively, if the first material layers 131 are undoped polysilicon layers that may serve as the sacrificial layers, and the second material layers 133 are doped polysilicon layers, then the conductive patterns 181A to 181E may be defined by the slit 171. In this example, only the first material layers 131 exposed through the sift 171 are removed by the selective etching process. Accordingly, the first recess regions are formed in the regions in which the first material layers 131 are removed. Next, the second interlayer insulation patterns ILD are formed by filling the first recess regions with an insulation material for the second interlayer insulation layer.

As described above, after the conductive patterns 181A to 181E and the second interlayer insulation patterns ILD are formed by various processes, and a second insulation layer 183 is formed in the slit 171.

Referring to FIG. 2H, second to fifth recess regions 191A to 191D are formed by etching the first insulation layer 155 of the cell array region CAR and the third interlayer insulation layer 161 of the contact region CTR and the peripheral circuit region PAR by a partial thickness using an etching process using a mask (not shown) as an etching barrier. Accordingly, a height of the first insulation layer 155 is less than a height of the first and second channel layers 153A and 153B. Here, the mask may be formed as a pattern for defining the second to fifth recess region 191A to 191D, and may be removed after the forming of the second to fifth recess regions 191A to 191D.

The second to fifth recess regions 191A to 191D may be formed to have the same depth or different depths. For example, if the first insulation layer 155 and the third interlayer insulation layer 161 are formed of the same material, then the second to fifth recess regions 191A to 191D may be formed to have the same depth. Alternatively, if the first insulation layer 155 and the third interlayer insulation layer 161 are formed of different materials, then the second to fifth recess regions 191A to 191D may have different depths.

The second recess region 191A is disposed in the peripheral circuit region PAR, the third recess region 191B is disposed in the contact region CTR, the fourth recess region 191C is disposed inside the first through hole 141A, and the fifth recess region 191D is disposed inside the second through hole 141B.

A plurality of second and third recess regions 191A and 191B may be formed. The shapes and sizes of the plurality of second and third recess regions 191A and 191B may be based on a size of a resistor to be formed, Further, the second recess region 191A may be spaced apart from the driving transistor DTR or overlapped with the driving transistor DTR.

Referring to FIG. 2I, the second to fifth recess regions 191A to 191D are filled with a conductive material, Accordingly, a first resistor 195A is formed inside the second recess region 191A, and a second resistor 195B is formed inside the third recess region 191B. Accordingly, a first resistance element region RAR1 that overlaps the peripheral circuit region PAR is defined and a second resistance element region RAR2 that overlaps the contact region CTR is defined.

Shapes or sizes of the first resistor 195A or the second resistor 195B may be varied based on a desired size or shape of resistor.

Further, a first conductive plug 195C is formed inside the fourth recess region 191C, and a second conductive plug 195D is formed inside the fifth recess region 191D. The first and second conductive plugs 195C and 195D are coupled to the contact plugs to be formed on the channel structure CH in a subsequent process to serve to improve contact resistance for the contact plug. Further, the first and second conductive plugs 195C and 195D and the first and second resistors 195A and 195B may be formed of a doped polysilicon layer. In this case, the first and second conductive plugs 195C and 195D may overlap the conductive patterns (for example, the conductive patterns 181E) for the select line to be used as the source region and the drain region.

When the second to fifth recess regions 191A to 191D are filled with the conductive material, the planarization process may be performed so that the conductive material is remains only inside the second to fifth recess regions 191A to 191D. In this case, the mask for defining the second to fifth recess regions 191A to 191D may be used as a planarization stopping layer. In this case, the mask for defining the second to fifth recess regions 191A to 191D may be removed after the first and second resistors 195A and 195B and the first and second conductive plugs 195C and 195D are formed.

As described above, the first and second conductive plugs 195C and 195D of the cell array region CAR and the first and second resistors 195A and 195B may be simultaneously formed, so that a process of manufacturing the semiconductor device including the resistor may be simplified. The first and second resistors 195A and 195B and the first and second conductive plugs 195C and 195D may be simultaneously formed, so that the first and second resistors 195A and 195B may have the same heights as the first and second conductive plugs 195C and 195D. The first and second resistors 195A and 195B may be separated from the driving transistor DTR and the conductive patterns 181A to 181E through the third interlayer insulation layer 161. Accordingly, the first and second resistance element regions RAR1 and RAR2 in which the first and second resistors 195A and 195B may overlap the peripheral circuit region PAR and the contact region CTR, respectively, thereby improving integration of the semiconductor device.

In an exemplary embodiment, the cell string is formed in an U shape along the channel structure CH, including the first and second channel layers 153A and 153B, and extends higher than the substrate 101 in the cell array region CAR, and higher than the pipe channel layer 153C coupling the first and second channel layers 153A and 153B. The first and second channel layers 153A and 153B are formed inside the first and second through holes 141A and 141B and pass through the second interlayer insulation patterns ILD and the conductive patterns 181A to 181E, which are alternately stacked on the substrate 101. Accordingly, the first and second channel layers 153A and 153B are surrounded by the second interlayer insulation patterns ILD and the conductive patterns 181A to 181E. The pipe channel layer 153C is disposed inside the trench 111 of the pipe gate PG, which is formed under the first and second channel layers 153A and 153B and stacked on the substrate 101. Accordingly, the pipe channel layer 153C is surrounded by the pipe gate PG. A pipe transistor is defined in a crossing portion of the pipe channel layer 153C and the pipe gate PG. The memory cells are defined in crossing portions of the first and second channel layers 153A and 153B and the conductive patterns for the word lines (for example, the conductive patterns 181A to 181D), and the select transistors are defined in crossing portions of the first and second channel layers 153A and 153B and the conductive patterns for the select line (for example, the conductive pattern 181E).

Although it is not illustrated in the drawing, after the first and second conductive plugs 195C and 195D and the first and second resistors 195A and 195B are formed, the common source line, the bit lines, the contact plugs, and the metal wirings are formed. Here, at least one (for example, a first contact plug) of the contact plugs is coupled to one of the conductive patterns 181A to 181E, at least one (for example, a second contact plug) among the contact plugs is coupled to the driving transistor DTR, and at least one of the metal wirings is coupled to the first and second contact plugs, so that the driving transistor DTR may be coupled with the conductive patterns 181A to 181E. In this case, the first contact plug, which passes through the third interlayer insulation layer 161, is disposed so as not to be coupled to the second resistor 195B, and the second contact plug, which passes through the third interlayer insulation layer 161, is disposed so as not to be coupled to the first resistor 195A. Further, although it is not illustrated in the drawing, third contact plugs are formed on the first resistor 195A and the second resistor 195B, and a metal wiring coupling a part among the third contact plugs may be formed. Accordingly, the resistors having various values may be implemented by coupling the first resistor 195A and the second resistor 195B.

Figure 3:
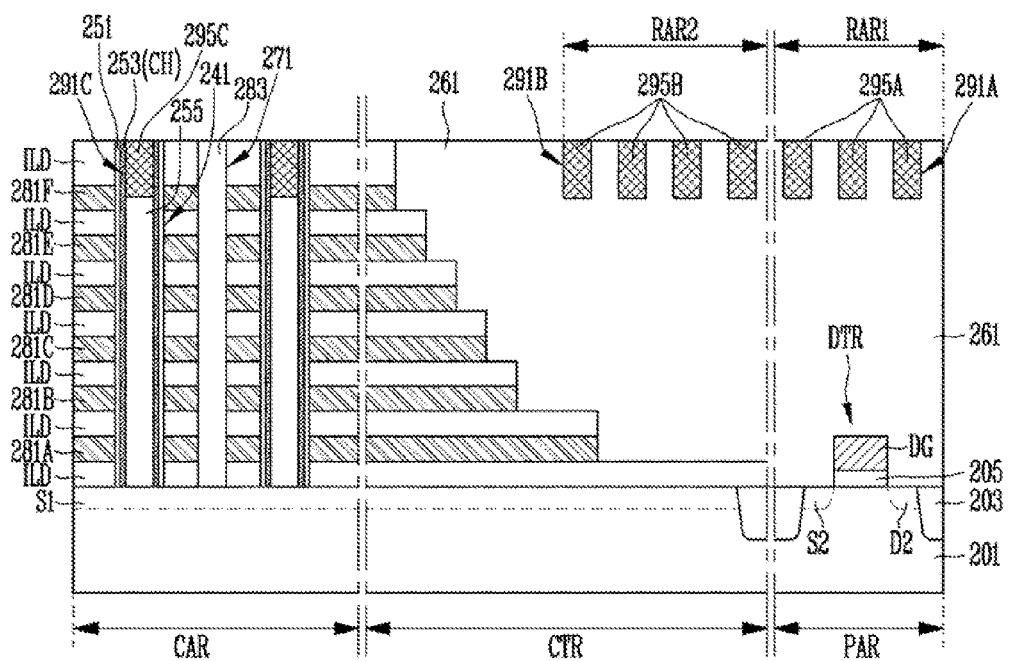
FIG. 3 is a view for describing a semiconductor device according to an exemplary embodiment of the present invention, and a method of manufacturing the same.

FIG. 3 is a view for describing an exemplary semiconductor device, and a method of manufacturing the same.

The exemplary semiconductor device includes a substrate 201 including a cell array region CAR, the contact region CTR, and the peripheral circuit region PAR, and resistance element regions RAR1 and RAR2 overlapping at least one of the contact region CTR and the peripheral circuit region PAR on the substrate 201. The first resistance element region RAR1 may overlap the peripheral circuit region PAR and the second resistance element region RAR2 may overlap the contact region CTR. An isolation layer 203 for isolating elements may be formed inside the substrate 201.

A source region S1 of the cell string may be formed inside the substrate 201 in the cell array region CAR, and a plurality of cell strings coupled to the source region S1 is formed on the substrate 201 in the cell array region CAR. Each of the cell strings is formed along a channel structure CH including a channel layer 253 extending higher than an upper portion of the substrate 201.

The channel layer 253 is formed along side walls defining the through hole 241, which passes through first interlayer insulation patterns ILD and the conductive patterns 281A to 281F, which are alternately stacked on the substrate 201. Accordingly, the channel layer 253 is coupled to the source region S1, and is surrounded with the first interlayer insulation patterns ILD and the conductive patterns 281A to 281F. The channel layer 253 may be formed in a tubular shape manner having an open central portion, and the central portion of the tubular shape is filled with a first insulation layer 255. The first insulation layer 255 may have a height that is lower than a height of the channel layer 253.

A material layer 251 including a charge stopping layer, a memory layer, or a tunnel insulation layer may be formed between the channel layer 253 and the conductive patterns 281A to 281F. The material layer 251 may be extended to a space between the channel layer 253 and the first interlayer insulation patterns ILD.

The conductive patterns 281A to 281F and the first interlayer insulation patterns ILD are extended from the cell array region CAR to the contact region CTR. Edges of the conductive patterns 281A to 281F and the first interlayer insulation patterns ILD are formed in the contact region CTR in a stepwise structure.

At least one layer of lowermost conductive pattern, among the conductive patterns 281A to 281F, may be used as a first select line. At least one layer of uppermost conductive pattern, among the conductive patterns 281A to 281F, may be used as a second select line. Conductive patterns between the first select line and the second line may be used as the word lines. Memory cells are defined in crossing portions of the channel layer 253 and the conductive patterns for the word lines (for example, conductive patterns 281B to 281E). A first select transistor is defined in a crossing portion of the channel layer 253 and the conductive pattern for the first select line (for example, the conductive pattern 281A). A second select transistor is defined in a crossing portion of the channel layer 253 and the conductive pattern for the second select line (for example, the conductive pattern 281F).

The conductive patterns 281A to 281F and the first interlayer insulation patterns ILD may be isolated for each memory block or for each line by a slit 271 passing through the conductive patterns 281A to 281F and the first interlayer insulation patterns ILD. The slit 271 may be formed between the channel layers 253. The slit 271 is filled with a second insulation layer 283.

A driving transistor DTR is formed in the peripheral circuit region PAR. The driving transistor DTR includes a gate insulation layer 205 formed on the substrate 201, a driving gate DG formed on the gate insulation layer 205, and a source region S2 and a drain region D2 formed inside the substrate 201 at both sides of the driving gate DG.

The driving transistor DTR, the conductive patterns 281A to 281F, and the first interlayer insulation patterns ILD of the contact region CTR, which have the stepwise structure, are covered by a second interlayer insulation layer 261. The second interlayer insulation layer 261 may be formed to have a flat surface.

At least one first recess region 291A is formed in the second interlayer insulation layer 261 of the peripheral circuit region PAR, and at least one second recess region 291B is formed in the second interlayer insulation layer 261 of the contact region CTR. A third recess region 291C is defined by the first insulation layer 255, which is lower than the channel layer 253, in the through hole 241. The first to third recess regions 291A, 291B, and 291C may be formed to have the same depth or different depths. A first resistor 295A is formed in the first recess region 291A, a second resistor 295B is formed in the second recess region 291B, and a conductive plug 295C is formed in the third recess region 291C. The first resistors 295A may be overlap the driving transistor DTR.

The first conductive plug 295C of the cell array region CAR and the first and second resistors 295A and 295B may be simultaneously formed, so that a process of manufacturing the semiconductor device including the resistor may be simplified. The first and second resistors 295A and 295B and the conductive plug 295C may be simultaneously formed, so that the first and second resistors 295A and 295B may a same height as a height of the conductive plug 295C. The first and second resistors 295A and 295B may be separated from the driving transistor DTR and the conductive patterns 281A to 281F by the second interlayer insulation layer 261. The first resistance element region RAR1 may overlap the peripheral circuit region PAR and second the resistance element region RAR2 in may overlap the contact region CTR, thereby improving integration of the semiconductor device.

An exemplary method of manufacturing the semiconductor device will be described in more detail below.

The isolation layer 203 is formed on the substrate 201 including the cell array region CAR, the contact region CTR, and the peripheral circuit region PAR. An impurity for forming a well structure and an impurity for adjusting a threshold voltage may be injected into the substrate 201. Further, an impurity for forming the source region S1 of the cell string may be injected into the substrate 201.

Next, the gate insulation layer 205 and the driving gate DG are formed on the substrate 201 in the peripheral circuit region PAR, and then the source region S2 and the drain region D2 may be formed by injecting the impurity into the substrate 201 at both sides of the driving gate DG. As a result, the driving transistor DTR is formed.

Next, the first material layers 131 and the second material layers 133 are alternately stacked as illustrated in FIG. 2C A through hole 241 is formed by etching the first material layers 131 and the second material layers 133. Subsequently, the material layer 251, which includes at least one of the charge blocking layer, the memory layer, or the tunnel insulation layer, is formed along the surface of the through hole 241, and the channel layer 253 and the first insulation layer 255 are formed as illustrated in FIG. 2D.

Subsequent processes are similar to those described above, with reference to FIGS. 2E to 2I.

Figure 4:
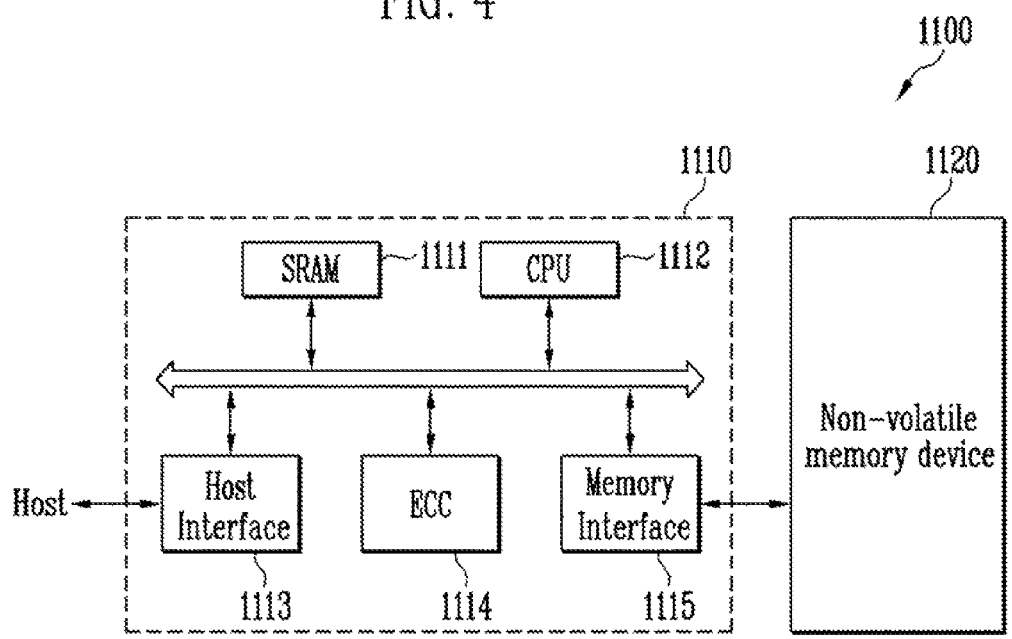
FIG. 4 is a configuration diagram illustrating an exemplary memory system.

FIG. 4 is a configuration diagram illustrating an exemplary memory system.

Referring to FIG. 4, an exemplary memory system 1100 may include a non-volatile memory device 1120 and a memory controller 1110.

The non-volatile memory device 1120 may include the semiconductor memory devices described with reference to FIGS. 1 to 3. The non-volatile memory device 1120 may be provided as a multi-chip package including a plurality of flash memory chips.

The memory controller 1110 is configured to control the non-volatile memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol of a host coupled with the memory system 1100. Further, the ECC 1114 detects and corrects an error included in data read from the non-volatile memory device 1120, and the memory interface 1115 performs interfacing with the non-volatile memory device 1120. In addition, the memory controller 1110 may further include a ROM, or the like, for storing code data for interfacing with a host.

The memory system 1100 including the aforementioned configuration may be a memory card or a Solid State Disk (SSD) in which the non-volatile memory device 1120 is combined with the memory controller 1110. For example, when the memory system 1100 is the SSD, the memory controller 110 may communicate with an external device (for example, a host) through one among various interface protocols, such as USB, MMC, PCI-E, SATA, PATA, SCSI, ESDI, or IDE.

Figure 5:
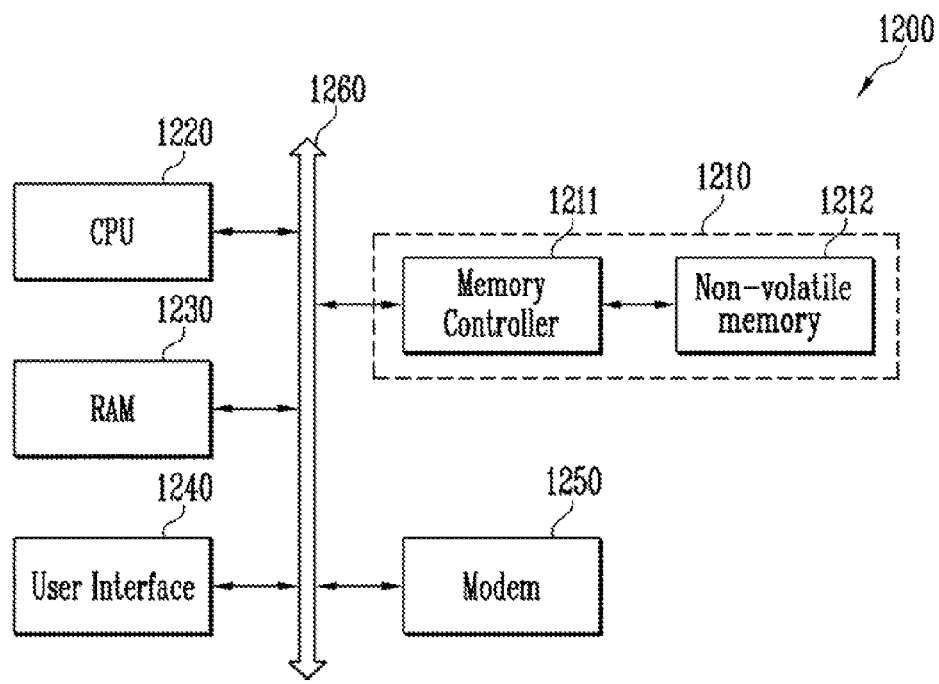
FIG. 5 is a configuration diagram illustrating an exemplary computing system.

FIG. 5 is a configuration diagram illustrating an exemplary computing system according.

Referring to FIG. 5, the exemplary computing system 1200 may include a CPU 1220 electrically connected to a system bus 1260, a RAM 1230, a user interface 1240, a modem 1250, and a memory system 1210. Further, when the computing system 1200 is a mobile device, the computing system 1200 may further include a battery for supplying an operating voltage to the computing system 1200, and may further include an application chip-set, a Camera Image Processor (CIS), or a mobile DRAM.

The memory system 1210 may include a non-volatile memory 1212 and a memory controller 1211 as described with reference to FIG. 4.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A method of manufacturing a semiconductor device, the method comprising:
    alternately stacking first material layers and second material layers on a substrate including a first region and a second region;
    forming a through hole passing through the first material layers and the second material layers formed on the first region of the substrate;
    forming a channel layer in the through hole;
    etching the first material layers and the second material layers formed on the second region;
    forming an interlayer insulation layer in the second region and over the etched first material layers and the etched second material layers;
    forming a first recess region by etching the interlayer insulation layer on the second region of the substrate; and
    forming a resistor inside the first recess region.

2. The method of claim 1, further comprising:
    forming an insulation layer in the through hole;
    forming a second recess region in the through hole by etching the insulation layer; and
    forming a conductive plug in the second recess region,
    wherein the channel layer is formed along a surface defining the through hole so that the channel layer has a tubular shape having a central portion filled with the insulation layer and the conductive plug.

3. The method of claim 2, wherein the forming the second recess region and the fanning the first recess region are simultaneously performed.

4. The method of claim 2, wherein the forming the conductive plug and the forming a resistor are simultaneously performed.

5. The method of claim 1, further comprising:
    forming a driving gate in the second region before the forming of the first material layers and the second material layers.

6. The method of claim 5, wherein the forming the resistor further comprises:
    forming a first resistor to overlap the driving gate.

7. The method of claim 1, wherein the etching the first material layers and the second material layers further comprises:
    etching edges of the first material layers and edges of the second material layers in the second region to have a stepwise structure.

8. The method of claim 7, wherein the interlayer insulation layer covers the stepwise structure, and the resistor includes a second resistor disposed in the interlayer insulation layer over the stepwise structure.

9. The method of claim 1, wherein the resistor is formed of a doped polysilicon layer.

10. A method of manufacturing a semiconductor device, the method comprising:
    alternately stacking first material layers and second material layers on a substrate including a first region and a second region;
    etching the first material layers and the second material layers formed on the second region so that edges of the first material layers and edges of the second material layers in the second region have a stepwise structure;
    forming an interlayer insulation layer in the second region and over the etched first material layers and the etched second material layers;
    forming a first recess region by etching the interlayer insulation layer on the second region of the substrate; and
    forming a resistor inside the first recess region.

11. The method of claim 10, further comprising:
    forming a through hole passing through the first material layers and the second material layers formed on the first region of the substrate;
    forming a tubular-shaped channel layer along a surface defining the through hole, so that the channel layer has an open central portion;
    forming an insulation layer in the central portion of the tubular-shaped channel layer;
    forming a second recess region in the through hole by etching the insulation layer; and
    forming a conductive plug in the second recess region.

12. The method of claim 11, wherein the forming of the second recess region and the forming of the first recess region are simultaneously performed.

13. The method of claim 11, wherein the forming of the conductive plug and the forming of the resistor are simultaneously performed.

14. The method of claim 10, further comprising:
    forming a driving gate in the second region before the forming of the first material layers and the second material layers.

15. The method of claim 14, wherein the forming the resistor further comprises:
    forming a first resistor to overlap the driving gate.

16. The method of claim 10, wherein the interlayer insulation layer covers the stepwise structure, and
    wherein the resistor includes a second resistor disposed in the interlayer insulation layer over the stepwise structure.

17. The method of claim 10, wherein the resistor is formed of a doped polysilicon layer.

* * * * *